(12) United States Patent
Forbes

(10) Patent No.: US 6,952,117 B2
(45) Date of Patent: Oct. 4, 2005

(54) DISTRIBUTED CLOCK GENERATOR FOR SEMICONDUCTOR DEVICES AND RELATED METHOD OF OPERATING SEMICONDUCTOR DEVICES

(75) Inventor: Leonard Forbes, Corvalis, OR (US)

(73) Assignee: Micron Technology Inc., Boise, ID (US)

( * ) Notice: Subject to any disclaimer, the term of this patent is extended or adjusted under 35 U.S.C. 154(b) by 139 days.

(21) Appl. No.: 10/093,861

(22) Filed: Mar. 8, 2002

(65) Prior Publication Data

US 2003/0169087 A1 Sep. 11, 2003

(51) Int. Cl.$^7$ .............................. H03B 1/00; H03K 3/00
(52) U.S. Cl. .......................... 326/93; 327/291; 331/57
(58) Field of Search .............................. 326/93, 95, 98; 327/291, 293; 331/57

(56) References Cited

U.S. PATENT DOCUMENTS

| | | | | |
|---|---|---|---|---|
| 4,408,168 A | * | 10/1983 | Higuchi | 331/57 |
| 4,536,720 A | * | 8/1985 | Cranford, Jr. et al. | 331/57 |
| 4,816,778 A | * | 3/1989 | Weber | 331/57 |
| 5,424,690 A | * | 6/1995 | Ohno | 331/57 |
| 6,380,787 B1 | | 4/2002 | Forbes | 327/292 |
| 6,535,071 B2 | | 3/2003 | Forbes | 331/57 |
| 6,539,490 B1 | | 3/2003 | Forbes et al. | 713/401 |
| 6,552,564 B1 | | 4/2003 | Forbes et al. | 326/30 |

OTHER PUBLICATIONS

K. Ishibashi et al., "A Novel Clock Distribution System for CMOS VLSI," Proceedings, 1993 IEE Int'l Conf. on Computer Design: VLSI in Computers & Processors, pp. 289–292 (Oct. 1993).
K. Yip, "Clock Tree Distribution: Balance is Essential for Deep–Submicron ASIC Design to Flourish," IEEE Potentials, vol. 16(2), pp. 11–14 (Apr./May 1997).
K.M. Carrig et al., "A Clock Methodology for High–Performance Microprocessors," IEEE 1997 Custom Integrated Circuits Conference, pp. 119–122 (1997).
T. Knight & H.M. Wu, "A Method for Skew–Free Distribution of Digital Signals Using Matched Variable Delay Lines," Symp. on VLSI Circuits, pp. 19–20 (1993).
S.I. Liu et al., "Low–Power Clock–Deskew Buffer for High–Speed Digital Circuits," IEEE J. Solid–State Circuits, vol. 34(4), pp. 554–558 (1999).
A.V. Mule et al., "A 10GHz Hybrid Optical/Electrical Clock Distribution Network for Gigascale Integration," Proc. 1999 12th Annual IEEE Lasers and Electro–Optics Soc'y, pp. 277–283 (1998).
B. Madhavan, "A Novel High Speed Low Skew Clock Distribution Scheme in 0.8 Micron CMOS," IEEE Int'l Symp. on Circuits and Systems, pp. 149–152 (May 1996).
H. Sutoh & K. Yamakoshi, "A Clock Ditribution Technique With An Automatic Skew Compensation Circuit," IEICE Trans. Electron, vol. E81–C, No. 2, pp. 277–283 (Feb. 1998).
J.L. Neves & E.G. Friedman, "Automated Synthesis of Skew–Based Clock Distribution Networks," VLSI Design, vol. 7, No. 1, pp. 31–57 (1998) (Abstract Only).

* cited by examiner

*Primary Examiner*—Daniel D. Chang
(74) *Attorney, Agent, or Firm*—Wong, Cabello, Lutsch, Rutherford & Brucculeri, LLP

(57) ABSTRACT

A distributed clock generator for a semiconductor device. In one embodiment, the clock generator is not localized in one particular location on the semiconductor die and then distributed, but instead the clock generation itself is distributed throughout the integrated circuit. The clock generator itself is a CMOS phase shift oscillator which uses a series resistance and a capacitance to ground. Phase shift elements utilize the phase shift of distributed transmission lines around the integrated circuit die and are thus conveniently implemented using the series resistance and parallel capacitance of the transmission lines.

33 Claims, 7 Drawing Sheets

DISTRIBUTED CLOCK GENERATOR FOR SEMICONDUCTOR DEVICES AND RELATED METHOD OF OPERATING SEMICONDUCTOR DEVICES

FIELD OF THE INVENTION

This invention relates generally to semiconductor devices, and more particularly relates to semiconductor memory devices operable using a clock signal.

BACKGROUND OF THE INVENTION

The field of semiconductor memory devices is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

One of the more common categories of semiconductor memory devices used today is the dynamic random access memory, or DRAM. Among the desirable characteristics of any DRAM are a high storage capacity per unit area of semiconductor die area, fast access speeds, low power consumption, and low cost.

One approach that has been used to optimize the desirable properties of DRAM has been to design such devices such that they are accessible synchronously. A synchronous DRAM typically requires an externally-applied clocking signal, as well as other externally-applied control signals whose timing must bear certain predetermined relationships with the clock signal. Likewise, digital data is read from and written to a synchronous memory device in a synchronous relationship to the externally-applied clock signal. Synchronous DRAM technologies have been under development for many years, and synchronous DRAM (frequently referred to as "SDRAM") is used in a broad spectrum of commercial and industrial applications, including the personal computer industry.

In typical implementations, the external clock signal CLK for a clocked semiconductor device (memory device or otherwise) comprises a simple, periodic "square" wave, oscillating with reasonably uniform periodicity between a logical high voltage level (for example, 3.3V) and a logical low level (typically 0V) with a duty cycle of 50% (meaning that the signal is at a logical "high" level the same amount of time that it is at a logical "low" level during each complete clock cycle). In present state-of-the-art semiconductor devices, the clock signal may have a frequency on the order of hundreds of megahertz.

A synchronous (clocked) semiconductor device typically requires an external clock signal to be applied to a clock (CLK) input. In the prior art, it is most commonly the case that the inputted CLK signal is provided to an internal, central clock generator circuit, which in turn generates one or more internal clock signals that are routed to various functional blocks located at various locations on the semiconductor substrate.

One consideration that must be addressed relative to the routing of clock signals throughout a synchronous semiconductor device is the well-know problem of clock skew. See, for example, K. Yip, "Clock Tree Distribution: Balance is Essential for a Deep Sub-Micron ASIC Design to Flourish," *IEEE Potentials*, vol. 16, no. 2, pp. 11–14, April–May 1997.

Those of ordinary skill in the art will understand that the issue of clock skew relates to the inevitable variations in the arrival time of clock signals at different locations on a semiconductor substrate, where the master clock signal is generated at a single location on the part. Such variations arise due to such factors as propagation delays, variations in device switching speeds, and the like. Clock skew is a function of two main parameters: the loading presented to the logic being clocked and the RC (resistive-capacitive) delay of the clock-line interconnect. Interconnect factors that affect clock skew include the resistance, capacitance, and inductance of the interconnecting conductors ("wires"), which typically comprise metal or otherwise conductive traces formed as part of the semiconductor fabrication process.

Conductive wires in an integrated circuit (IC) are not ideal conductors, and differing lengths of wires in an IC can result in different delays in the propagation of clock signals throughout the IC. As is widely recognized, clock skew adds to the effective clock cycle time for a given semiconductor device, and hence adversely affects the performance of the device.

For circuit designers, a typical rule-of-thumb regarding clock skew is that it should be limited to ten percent or less of a chip's clock cycle, meaning that for a 100 Mhz clock, skew must be 1 nsec or less for each clock signal in the device. High-performance semiconductor devices may require that the clock skew be limited to 5% or less of the clock cycle; for a 500 Mhz clock this would require skew to be 100 picoseconds or less.

As noted, prior art designs have concentrated on having one central clock generator from which clock signals are distributed to functional blocks throughout the devices. Different strategies have been employed for clock signal distribution to avoid adverse consequences of clock skew. Perhaps the most common approach is to lay out the device such that all clock connections are symmetrical and of the same length. An example of this is the "H-tree" clock distribution scheme shown in FIG. 1a, wherein the conductive trace 12 representing the conductive traces for a clock signal are shown on a semiconductor substrate 10. An H-tree clock distribution strategy is used mostly in custom layouts and can further involve varying tree interconnect segment widths to balance skew throughout the IC.

Another known clock distribution strategy is the grid layout, such as the clock signal conductor 14 shown on substrate 10 in FIG. 1b. A clock grid is perhaps the simplest clock distribution scheme and has the advantage of being relatively easy to design for low skew. However, as those of ordinary skill in the art will appreciate, a clock grid is highly inefficient in terms of occupation of area on the substrate 10 and very "power hungry" due to the large number of clock interconnects required. Nevertheless, some manufacturers do use this approach, in particular, for microprocessors.

For high-performance semiconductor devices, a balanced tree distribution network 16 is often employed. For a balanced tree without buffers, the clock line capacitance increases exponentially starting from the leaf cell (i.e., a clocked element, an exemplary one being designated with reference numeral 18 in FIG. 1c) and moving toward the clock input at the root 20 of the tree. This extra capacitance results from the increasingly wider metal traces needed to carry current to the branching segments. The extra metal required further results in additional chip area to accommodate the extra clock-line width.

Buffers may be added at the branching points of a balanced tree clock network, and this can have the effect of significantly reduce clock interconnect capacitance, since it reduces clock-line width toward the root. An example of a tree clock network 22 is with buffers 24 is shown in FIG. 1d. However, the buffers 24 undesirably occupy additional area on the substrate and increase circuit complexity.

Those of ordinary skill in the art will appreciate that factors that contribute to clock skew include loading mismatch at the clocked elements, mismatch in RC delay due to variations in segment width and segment length among the clock line segments, and process variations induced during chip fabrication. Inductance effects start to appear as clock-edge times and interconnect resistance decrease, both of which occurring more often with shrinking chip technology and higher clock rates. Clock trees often require wide traces at their roots and may also have long segments, making the trees more susceptible to inductance problems than other clock network schemes.

Careful layout, including placing power and ground lines next to, above, or below clock trees to act as shields, and can help reduce the possibility of clock problems caused by inductance. Many designers and parasitic extraction/evaluation tools presently available address only RC parasitic effects. IC designers have heretofore not commonly considered parasitic inductances, although this is more frequently considered as clock frequencies on state-of-the-art semiconductors are approaching (or exceeding) 1 Ghz.

A different approach to addressing the problem with clock skew is referred to as "delay-locked loop" or "DLL." Various examples of DLL implementations for synchronous memory devices are proposed in U.S. Pat. No. 5,920,518 to Harrison et al., entitled "Synchronous Clock Generator Including Delay-Locked Loop;" U.S. Pat. No. 6,201,424B1 to Harrison, entitled "Synchronous Clock Generator including a Delay-Locked Loop Signal-Loss Detector;" and U.S. Pat. No. 6,130,856 to McLaury, entitled "Method and Apparatus for Multiple Latency Synchronous Dynamic Random Access Memory." The aforementioned '518, '424, and '856 patents are each commonly assigned to the Assignee of the present invention and each are hereby incorporated by reference herein in their respective entireties.

The function of a DLL circuit in a semiconductor device is to adjust the relative timing of clock signals provided to functional elements disposed at various locations on a semiconductor die such that overall synchronous operation of the device can be achieved. DLL implementations may utilize some type of loop-back operation whereby the DLL circuit is provided with feedback for comparing the timing of clock signals provided on various lines and provided to various functional elements of the device. As a result of the functionality of a typical DLL circuit, if the propagation and loading characteristics of one clock signal transmission line vary significantly from others, the DLL circuit can account for such differences in order to ensure that proper device operation can be maintained. Separate delays and skews (programmable or automatically adjusted) may be introduced into the externally-applied clock signal to ensure that each of the functional blocks in the device receives a clock signal that is substantially synchronized with the others. Such delays and skews may be miniscule, on the order of picoseconds, but may be nonetheless critical to proper operation of a semiconductor device.

Another approach to addressing the problem of clock skew involves using low-impedance lines with matched terminations and current mode signaling to achieve well-defined, and hence more readily compensated-for, delays. See, for example, T. Knight et al., "Method for Skew-Free Distribution of Digital Signals Using Matched Variable Delay Lines," *Symposium on VLSI Circuits*, Kyoto, Japan, May 19–21, pp. 19–20 (1993); see also, S. I. Liu et al., "Low Power Clock Deskew Buffer for High Speed Digital Circuits," *IEEE Journal of Solid-State Circuits*, v. 34, no. 4, pp. 554–558 (1999).

Despite the various approaches proposed in the prior art, clock skew remains an ongoing challenge to integrated circuit designers, and it is believed that it is becoming increasingly important to address the issue of clock skew as device geometries shrink and system clock speeds rise.

SUMMARY OF THE INVENTION

The present invention relates to an apparatus and corresponding method for providing a clock signal to clocked logic elements located throughout an integrated circuit. In one embodiment of the invention, a distributed clock generator comprising a network of amplifier and phase shift elements, including field-effect transistors and a diodes functioning as low-gain amplifiers, and series resistances and capacitors to a ground plane functioning as phase shift elements. In one embodiment, the phase shift elements are implemented as segments of an interconnection line or transmission line interconnecting the distributed amplifiers. The transmission line segments may be configured as elongate metal interconnection lines each disposed in a spaced-apart relationship some distance above a ground plane of a semiconductor device so as to serve as a capacitance. The aggregate length of all transmission line segments is chosen to achieve the desired total amount of phase shift, and the transmission line segments are configured to form a closed loop extending throughout the surface area of the semiconductor die so as to provide a clock signal to various locations on the die.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein:

FIG. 3b is a cross-sectional depiction of a physical implementation of the phase shift element of FIG. 3a;

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1A:
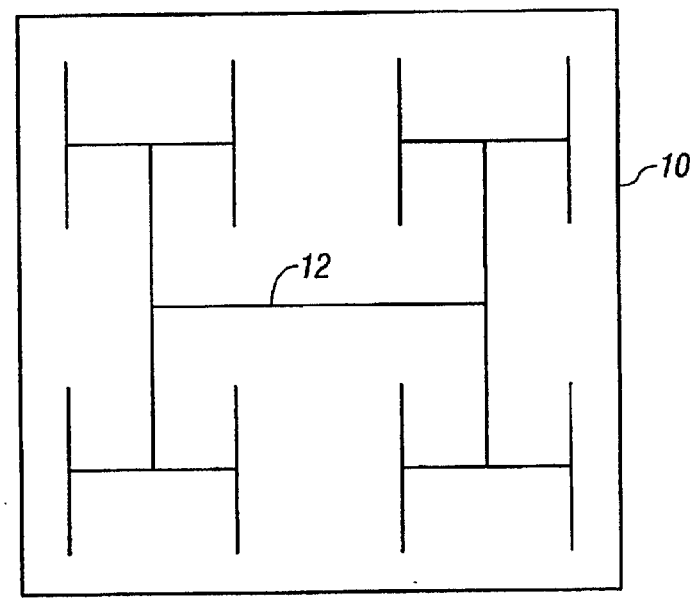
FIGS. 1a–1d depict alternative clock signal wiring network configurations for a semiconductor device.
Figure 1B:
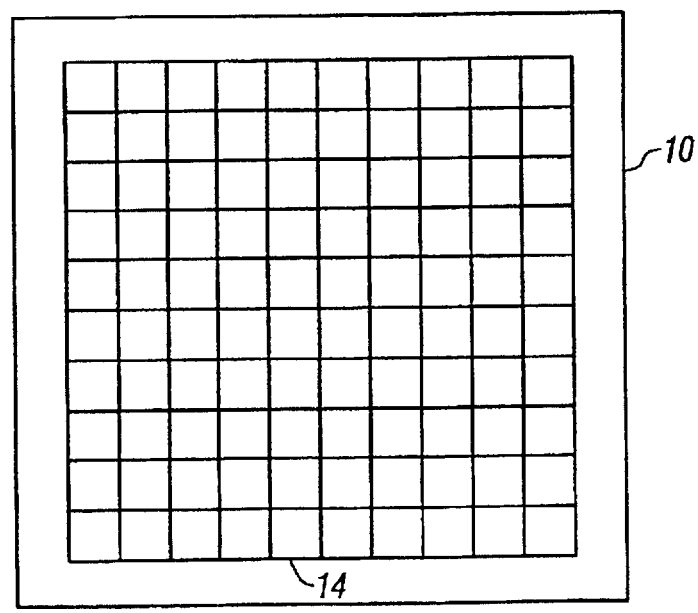
Figure 1C:
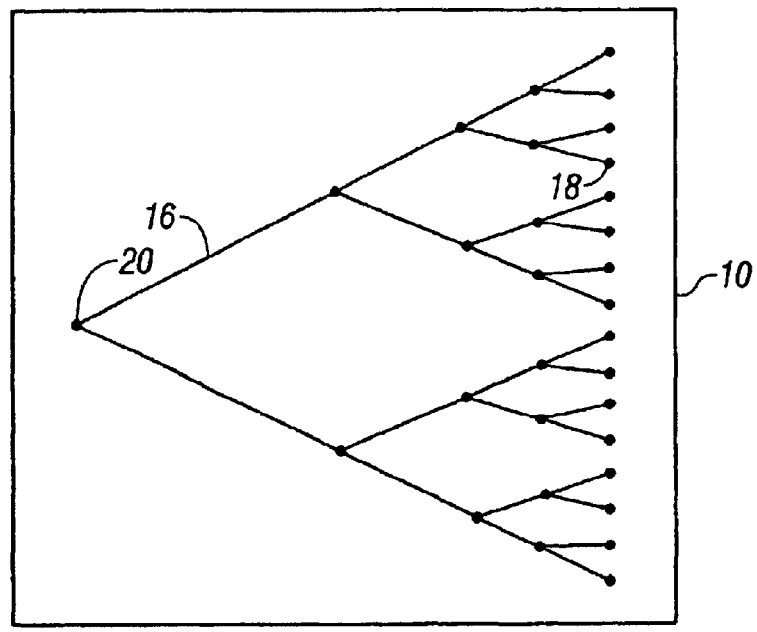
Figure 1D:
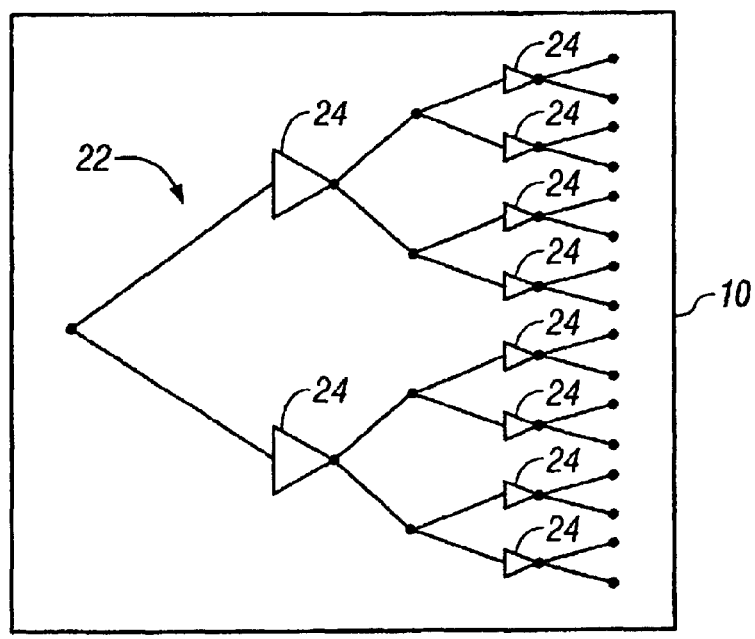
Figure 2:
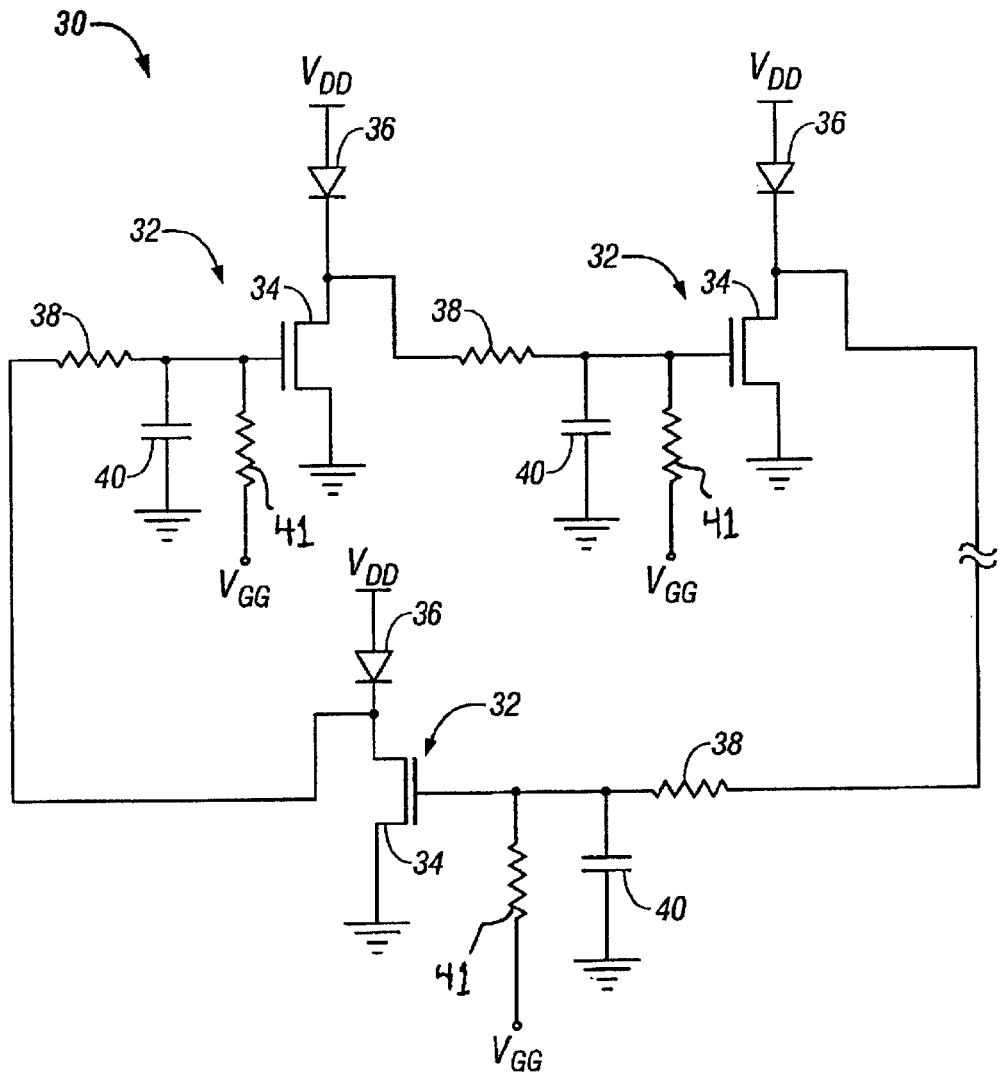
FIG. 2 is a schematic diagram of a distributed phase-shift clock generation system in accordance with one embodiment of the invention.

Referring to FIG. 2, there is shown a distributed clock generator circuit 30 in accordance with one embodiment of the invention. As shown in FIG. 2, clock generator circuit 30 comprises a plurality of amplifier/phase shift elements 32. Each amplifier/phase shift element 32 comprises an n-channel field-effect transistor (FET) 34 and a diode 36 which together function essentially as a low-gain amplifier. Each amplifier/phase shift element 32 further comprises a series resistance 38 and a capacitor 40. Optionally (although not shown in the Figures), each amplifier/phase shift element 32 may further comprise a gate bias supply resistance 41 coupled between the gate of respective transistor 34 and a gate bias voltage $V_{GG}$. In one embodiment, diodes 36 are implemented as diode-connected PMOS transistors.

Distributed clock generator circuit 30 can comprise an arbitrary number n of amplifier/phase shift elements 32. Those of ordinary skill in the art will appreciate that for each amplifier/phase shift element 32, the RC phase shifting network comprising resistor 38 and capacitor 40 introduces a phase shift in the signal amplified by the amplifier comprising FET 34 and diode 36. For a given implementation of the invention having an odd number n amplifier/phase shift elements 32, it is necessary to have the sum total of the phase shift across all amplifier/phase shift elements 32 equal to 180° (or some even integer multiple thereof) for proper operation of circuit 30. On the other hand, for an implementation having an even number n of amplifier/phase shift elements 32, the sum total of phase shift across all elements 32 must equal 360° (or some integer multiple thereof) for proper operation.

Figure 3A:
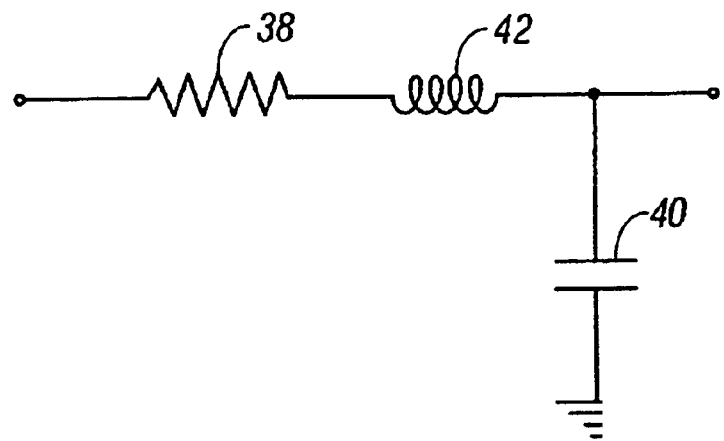
FIG. 3a is a schematic diagram of a phase shift element in the clock-generation system of FIG. 2.

In one embodiment of the invention, the individual phase shift networks comprising resistors 38 and capacitors 40 are implemented as segments of an interconnection line or transmission line interconnecting the individual amplifier/phase shift elements 32. FIG. 3a is a schematic diagram of a single amplifier/phase shift element from the embodiment of FIG. 2 in isolation. As can be seen in FIG. 3a, in addition to resistance 38 and capacitance 40, amplifier/shift element also has a parasitic inductive component represented in the schematic of FIG. 3a by inductor 42. As is discussed hereinbelow, the effects of parasitic inductor 42 are primarily relevant only at extremely high frequencies, and for the purposes of the present disclosure can be more or less ignored.

Figure 3B:
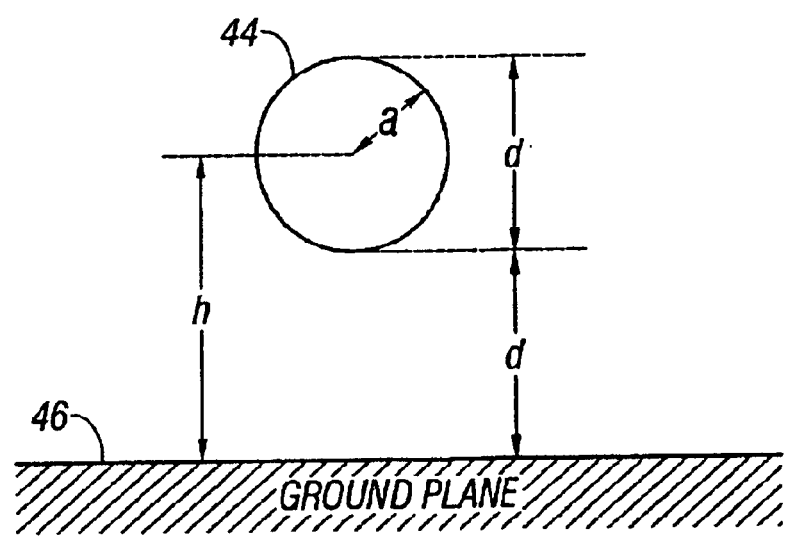

FIG. 3b is an end view of a phase-shift element 44 (at the same time representing both resistance 38 and capacitance 40) implemented in accordance with one embodiment of the invention as a substantially elongate metallic interconnection line between two amplifier/phase shift elements 32 in circuit 30. For the purposes of the present disclosure, the physical geometry of phase-shift element 44 is approximated as substantially cylindrical, although those of ordinary skill in the art will appreciate that processing practicalities will likely lead to a slightly different geometry; nonetheless, the approximation is sufficient for the purposes of the present disclosure and appreciation of the principles of the present invention.

With reference to FIG. 3b, phase shift element 44 is disposed in a spaced apart relationship a distance d above a ground plane 46 of a semiconductor device. Ground plane 46 may be a semiconductor substrate or a metal grounding layer formed atop a substrate in accordance with conventional semiconductor design and fabrication techniques. In the presently disclosed embodiment, phase shift element 44 has a height d substantially the same as the spacing between element 44 and the ground plane 46. Not shown in FIG. 3b is an oxide layer or other dielectric layer upon which phase shift element 44 is disposed to maintain the spacing d between phase shift element 44 and ground plane 46. The "radius" of phase shift element 44 (as noted above, phase shift element 44 may not be purely cylindrical) is a.

Those of ordinary skill in the art will appreciate that the capacitance of a cylinder over a plane is approximately calculated according to the following formula:

$$C = \frac{\pi \varepsilon}{\cosh^{-1}(h/a)} \qquad \text{(Equation 1)}$$

where $\varepsilon$ is the permittivity of the dielectric material between ground plane 46 and phase shift element 44, h is the distance between ground plane 46 and the central axis of phase shift element 44, and a is the radius of phase shift element a (again, assuming that phase shift element 44 is cylindrical is an approximation made for the purposes of simplifying the analysis).

In the presently disclosed illustrative example, it is assumed that dimension d (the spacing between phase shift element 44 and ground plane 46, as well as the height of phase shift element 44) is 1 micron, such that the dimension h is 1.5 microns. It is further assumed that the dielectric between phase shift element 44 and ground plane 46 is an oxide with a permittivity of $0.38 \times 10^{-12}$ F/cm. In this exemplary embodiment, therefore, the capacitance of phase shift element 44 can be calculated to be approximately 600 femto Farads per centimeter (fF/cm). The resistance is assumed to be on the order of $3 \times 10^2 \Omega$/cm, such that the RC value for each phase shift element is approximately $2.0 \times 10^{-10}$ fF$\Omega$/cm$^2$.

As noted above, those of ordinary skill in the art will appreciate that the phase shift elements 44 will also have some significant inductance; the effects of this inductance shall be described hereinbelow, and it will be apparent to those of ordinary skill in the art will appreciate that the inductive effects require a correction to the foregoing calculations but will not change the general concept of the invention or substantially change the operation of a distributed phase shift oscillator in accordance with the disclosed embodiment(s). In one embodiment, the inductance of the phase shift elements 32 is estimated to be on the order of 22 nH/cm.

Referring again to FIG. 3a, those of ordinary skill in the art will appreciate that the transfer function H of phase shift element 44 (ignoring, for the moment, inductive effects) can be approximated by:

$$H \cong \frac{\frac{1}{j\omega C}}{R + \frac{1}{j\omega C}} = \frac{1}{1 + j\omega RC} \qquad \text{(Equation 2)}$$

therefore, the angle of the transfer function H, i.e., ∠H, is given by:

$$\angle H = \tan^{-1}(\omega RC) \quad \text{(Equation 3)}$$

If ωRC is sufficiently small, the angle of the transfer function H can be approximated by:

$$\angle H \approx \omega RC = f(2\pi RC) \quad \text{(Equation 4)}$$

With the resistance and capacitance as calculated above, this resolves to:

$$\angle H \approx f \times (720 \times 10^{-10} \ deg/cm) \quad \text{(Equation 5)}$$

Figure 4A:
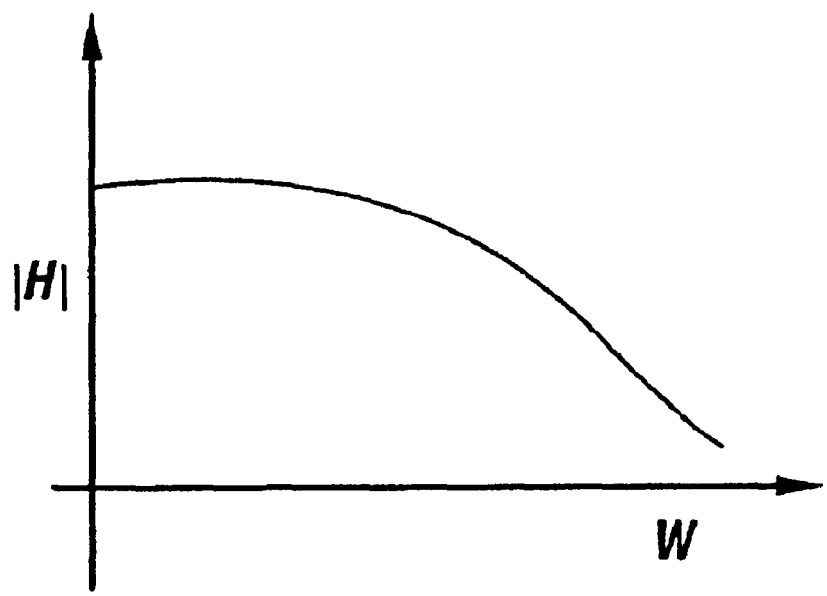
FIGS. 4a and 4b are plots of the magnitude and angle, respectively of the transfer function of the phase shift element of FIGS. 3a and 3b.
Figure 4B:
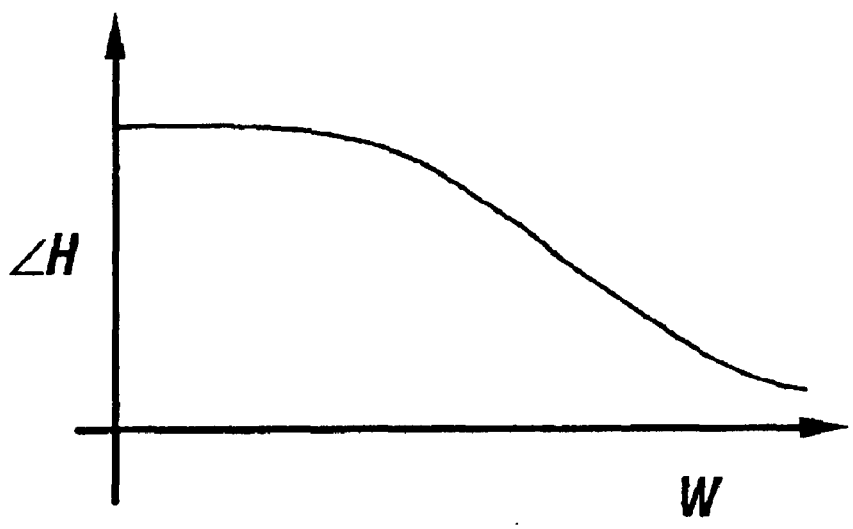

FIG. 4a is a plot of the magnitude of the transfer function H, i.e., |H|, and FIG. 4b is a plot of the angle of the transfer function H, i.e., ∠H. Consider an embodiment of the invention in which the operating frequency f of the distributed clock signal is 1.0 GHz. Consider further that an odd number, eleven, of phase shift elements 44 are used, such that a total of 180° of phase shift is required. With the RC value as calculated above, and using Equation 5 above, this means that a total length of 2.5 centimeters of phase shift elements is required to achieve a total of 180° of phase shift. If each of the eleven phase shift elements were of equal length, each element would contribute approximately 16° of phase shift. It is to be understood, however, that the present invention is not limited to implementations in which each phase shift transmission line 44 is the same length as the others. Indeed, depending upon the particular implementation, it may be desirable to provide phase shift elements 44 of various lengths. Those of ordinary skill in the art will appreciate that it is the aggregate length of all transmission lines 44 that is determinative of the overall amount of phase shift achieved.

Figure 5:
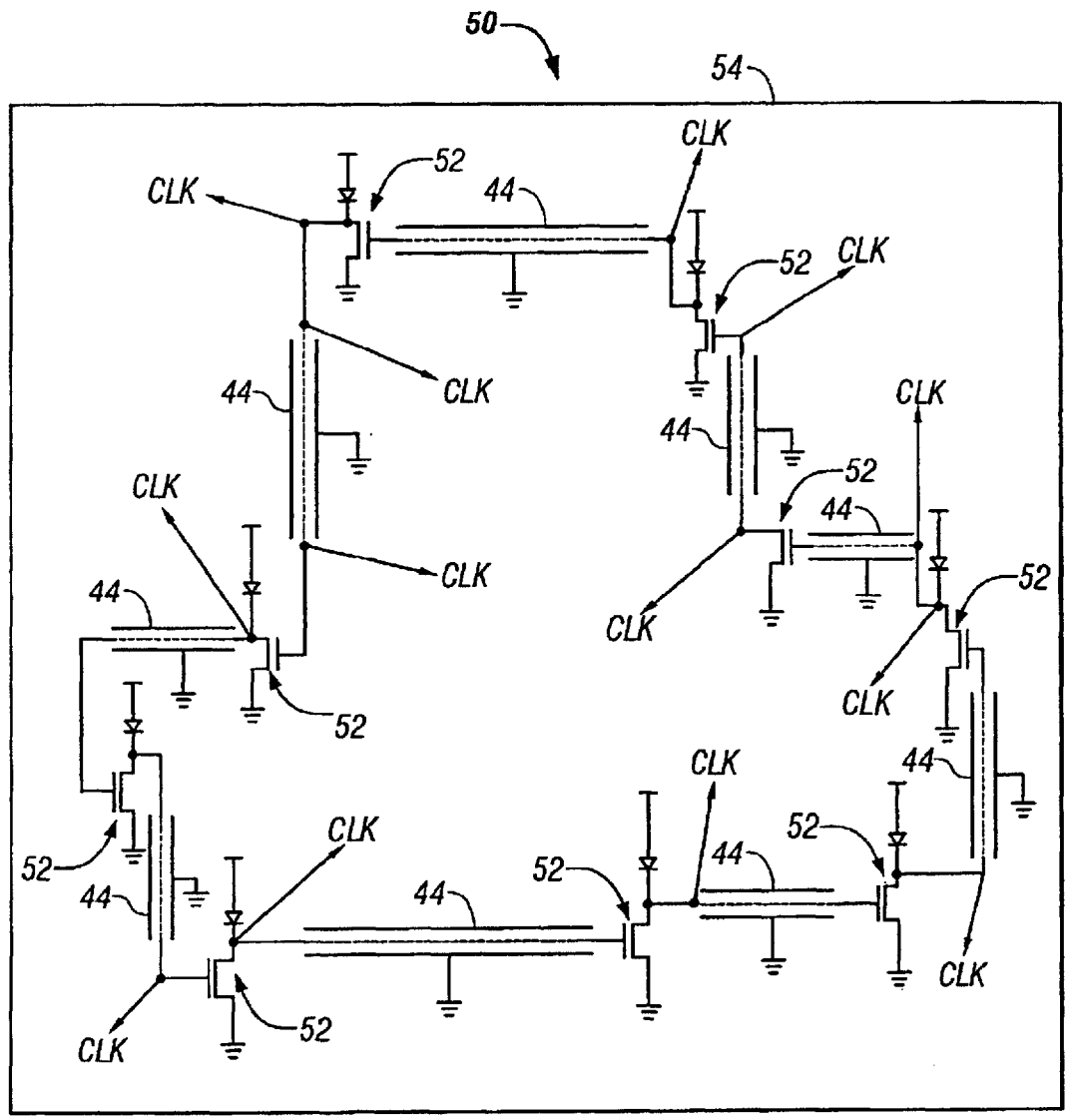
FIG. 5 is a schematic/block diagram of an integrated circuit incorporating a distributed phase-shift clock generation system in accordance with one embodiment of the invention.

Turning to FIG. 5, there is shown the physical layout of an integrated circuit 50 employing a distributed phase shift clock generating system in accordance with one embodiment of the invention. As shown in FIG. 5, the clock generator comprises a plurality of interconnection or transmission lines 44, which in one embodiment consist of 1 μm aluminum lines over 1 μm of oxide, as previously described with reference to FIG. 3b. The clock generation/distribution system further comprises a plurality of low-gain amplifiers 52 each consisting of a field-effect transistor (FET) having a source terminal connected via a diode to a positive voltage supply ($V_{ss}$) and a drain terminal coupled to ground. The interconnection lines 44 connect the amplifiers 52 in such a manner as to define a continuous, closed loop.

With continued reference to FIG. 5, each low-gain amplifier 52 may not only be used to drive the next transmission line segment 44, but also drive buffers (not shown) providing clock signals (CLK) to different areas and functional blocks on the integrated circuit 50, the physical edge thereof being designated with reference numeral 54 in FIG. 5. In accordance with one aspect of the invention, a precise signal with a well-known phase relationship is thereby provided at many different locations on the integrated circuit die. Each buffer is also preferably capable of serving to adjust the delay of clock signals (CLK) as necessary and appropriate for each functional block. Those of ordinary skill in the art will appreciate that the distributed phase shift oscillator arrangement shown in FIG. 5 provides a stable clock signal with precisely determined frequency and known phase relationship or delay at each location. This is in contrast to prior art clock generation schemes, in which a clock signal generated at one location is distributed around the area of the integrated circuit die.

As noted, the foregoing calculations generally ignore the inductive effects of individual phase-shifting line segments 44. That is, the effects of inductor 42 in the model depicted schematically in FIG. 3a were not entirely taken into account. As noted, on a short transmission line segment 44, the inductive effects can be expected to result in slightly larger phase shift than if the line segment is just represented by resistive and capacitive elements, as in the foregoing equations. The line segments can be made slightly shorter than the RC computations resolve to account for this approximation. These corrections do not effect the concept of operation, but rather are second-order effects which can be included in precise models and calculations.

In particular, the transfer function H for phase shift element 32 including inductive considerations can be expressed as:

$$H = \frac{\frac{1}{j\omega C}}{R + j\omega L + \frac{1}{j\omega C}} = \quad \text{(Equation 6)}$$

$$\frac{1}{(j\omega)^2 LC + j\omega RC + 1} = \left(\frac{1}{LC}\right)\left(\frac{1}{(j\omega)^2 + j\omega(R/L) + \frac{1}{LC}}\right)$$

where the magnitude |H| of the transfer function is given by:

$$|H| = \left(\frac{1}{LC}\right)\left(\frac{1}{\sqrt{\left(\left(\frac{1}{LC}\right) - \omega^2\right)^2 + \left(\frac{\omega R}{L}\right)^2}}\right) \quad \text{(Equation 7)}$$

and the angle ∠H of the transfer function is given by:

$$\angle H = \tan^{-1}\left(\frac{\left(\frac{\omega R}{L}\right)}{\frac{1}{LC} - \omega^2}\right) \quad \text{(Equation 8)}$$

Figure 6A:
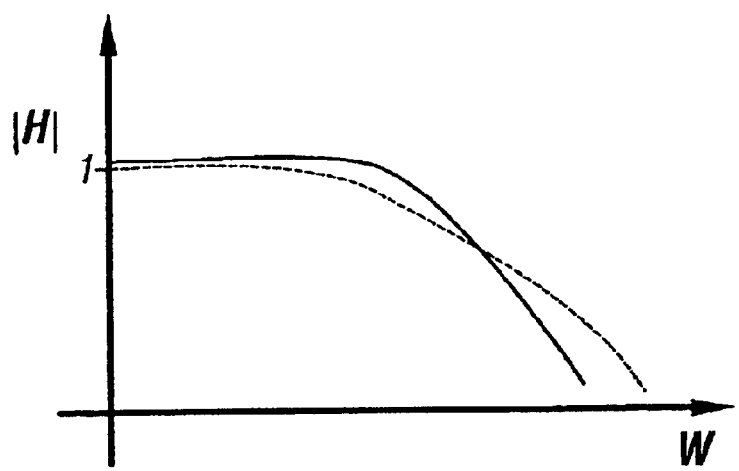
FIGS. 6a and 6b are plots of the magnitude and angle, respectively, of the transfer function of the phase shift element of FIGS. 3a and 3b taking into account inductive effects.
Figure 6B:
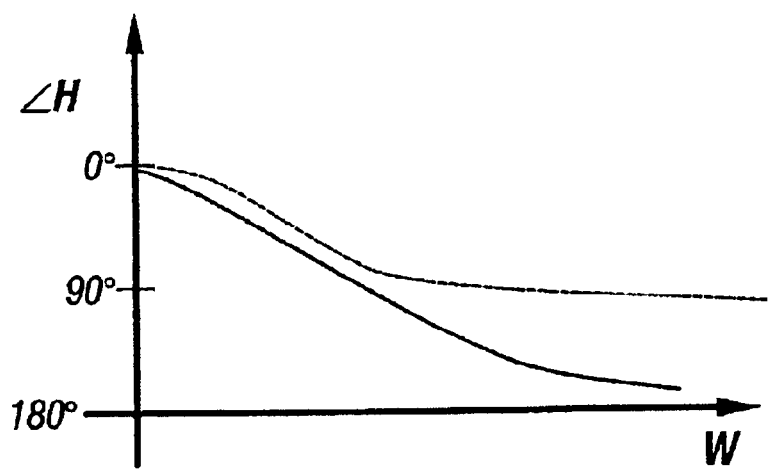

FIGS. 6a and 6b show exemplary plots of the magnitude and angle of the transfer function H of the phase shift elements 44, respectively, in accordance with one embodiment of the invention. In FIGS. 6a and 6b, the transfer function as calculated without taking into account the inductive effects is represented with dashed lines, while the transfer function as calculated including inductive effects is represented with solid lines. From FIG. 6b, it is apparent that on a short line segment 44 the inductive effects will result in a slightly larger phase shift than if the line is just modeled by its resistive and capacitive elements. The line segments can be made slightly shorter to compensate for this second-order differential.

From the foregoing detailed description of specific embodiments of the invention, it should be apparent that a distributed, phase shift oscillator for a semiconductor device has been disclosed. Although specific embodiments of the invention have been disclosed herein in some detail, this has been done solely for the purposes of describing various features and aspects of the invention, and is not intended to be limiting with respect to the scope of the invention. For instance, the particular dimensions and composition of phase shift elements 44 disclosed herein are provided for illustrating the basic principles of the present invention, and it is by no means intended that the invention be limited to the specific dimensions and composition disclosed herein. Likewise, it is contemplated that the invention may be practiced in connection with various categories of semiconductor devices requiring an on-chip clocking signal, including, without limitation, synchronous memory devices such as the synchronous DRAM disclosed in U.S. Pat. No. 6,327,196 to Mullarkey, entitled "Synchronous Memory Device Having an Adjustable Data Clocking Circuit," which patent is commonly assigned to the assignee of the present invention and hereby incorporated by reference herein in its entirety. It is contemplated that various substitutions, alterations, and/or modifications, including but not limited to those implementation variations which may have been suggested herein, may be made to the disclosed embodiments without departing from the spirit and scope of the invention as defined by the appended claims, which follow.

What is claimed is:

1. A distributed clock generator for generating a clock signal for a semiconductor device comprising:
   a plurality of amplifiers disposed at a plurality of locations on a semiconductor die;
   a plurality of phase shift elements each disposed between two of said plurality of amplifiers so as to define a continuous, closed loops;
   wherein said plurality of phase shift elements comprises segments of an elongate interconnect line extending between successive ones of said plurality of amplifiers and disposed above a dielectric layer covering a semiconductor substrate.

2. A distributed clock generator in accordance with claim 1, wherein each of said plurality of amplifiers comprises a field-effect transistor having a source terminal coupled to a positive voltage supply and to a first one of said plurality of phase shift elements, having a drain terminal coupled to ground potential, and having a gate coupled to a second one of said plurality of phase shift elements.

3. A distributed clock generator in accordance with claim 1, wherein said dielectric layer comprises an oxide layer.

4. A distributed clock generator in accordance with claim 1, wherein said plurality of phase shift elements comprises an odd number of phase shift elements introducing collectively substantially 180° of phase shift into said clock signal.

5. A distributed clock generator in accordance with claim 4, wherein said plurality of phase shift elements introduces an even integer multiple of 180° of phase shift into said clock signal.

6. A distributed clock generator in accordance with claim 1, wherein said plurality of phase shift elements comprises an even number of phase shift elements introducing collectively substantially 360° of phase shift into said clock signal.

7. A distributed clock generator in accordance with claim 6, wherein said plurality of phase shift elements comprises an integer multiple of 360° of phase shift into said clock signal.

8. A distributed clock generator in accordance with claim 1, wherein said clock signal has a frequency of at least about 1 GHz.

9. A distributed clock generator in accordance with claim 1, wherein said plurality of segments of an elongate interconnect line are of varying length.

10. A distributed clock generator in accordance with claim 9, wherein the aggregate length of said plurality of segments of an elongate interconnect line comprises an odd number of segments having an aggregate length such that the total phase shift provided by said phase shift elements is 180° or an even integer multiple of 180°.

11. A distributed clock generator in accordance with claim 9, wherein the aggregate length of said plurality of segments of an elongate interconnect line comprises an even number of segments having an aggregate length such that the total phase shift provided by said phase shift elements is 360° or an integer multiple of 360°.

12. A method of generating a clock signal in a semiconductor memory device fabricated on a semiconductor die, comprising:
   (a) providing a plurality of amplifiers disposed at a plurality of locations on said semiconductor die;
   (b) providing a plurality of phase shift elements each disposed between two of said plurality of amplifiers so as to define a continuous, closed loop;
   wherein said step (b) of providing a plurality of phase shift elements comprises providing an elongate interconnect line extending in individual segments between successive ones of said plurality of amplifiers, said elongate interconnect line being formed on a dielectric layer covering a semiconductor substrate.

13. A method in accordance with claim 12, wherein each of said plurality of amplifiers comprises a field-effect transistor having a source terminal coupled to a positive voltage supply and to a first one of said plurality of phase shift elements, having a drain terminal coupled to ground potential, and having a gate coupled to a second one of said plurality of phase shift elements.

14. A method in accordance with claim 12, wherein said dielectric layer comprises an oxide layer.

15. A method in accordance with claim 12, wherein said plurality of phase shift elements comprises an odd number of phase shift elements introducing collectively substantially 180° of phase shift into said clock signal.

16. A method in accordance with claim 15, wherein said plurality of phase shift elements introduces an even integer multiple of 180° of phase shift into said clock signal.

17. A method in accordance with claim 12, wherein said plurality of phase shift elements comprises an even number of phase shift elements introducing collectively substantially 360° of phase shift into said clock signal.

18. A method in accordance with claim 17, wherein said plurality of phase shift elements comprises an integer multiple of 360° of phase shift into said clock signal.

19. A method in accordance with claim 17, wherein said clock signal has a frequency of at least about 1 GHz.

20. A method in accordance with claim 12, wherein said plurality of segments of an elongate interconnect line are of varying length.

21. A method in accordance with claim 20, wherein the aggregate length of said plurality of segments of an elongate interconnect line comprises an odd number of segments having an aggregate length such that the total phase shift provided by said phase shift elements is 180° or an even integer multiple of 180°.

22. A method in accordance with claim 20, which the aggregate length of said plurality of segments of an elongate interconnect line comprises an even number of segments having an aggregate length such that the total phase shift provided by said phase shift elements is 360° or an integer multiple of 360°.

23. A semiconductor memory device having a plurality of functional blocks disposed in spaced apart relationships on a semiconductor die, comprising:
   a plurality of amplifiers disposed at a plurality of locations on said semiconductor die;
   a plurality of phase shift elements each disposed between two of said plurality of amplifiers so as to define a continuous, closed loop;

wherein said plurality of phase shift elements comprises segments of an elongate interconnect line extending between successive ones of said plurality of amplifiers and disposed above a dielectric layer covering a semiconductor substrate.

24. A semiconductor memory device in accordance with claim 23, wherein each of said plurality of amplifiers comprises a field-effect transistor having a source terminal coupled to a positive voltage supply and to a first one of said plurality of phase shift elements, having a drain terminal coupled to ground potential, and having a gate coupled to a second one of said plurality of phase shift elements.

25. A semiconductor memory device in accordance with claim 23, wherein said dielectric layer comprises an oxide layer.

26. A semiconductor memory device in accordance with claim 23, wherein said plurality of phase shift elements comprises an odd number of phase shift elements introducing collectively substantially 180° of phase shift into said clock signal.

27. A semiconductor memory device in accordance with claim 27, wherein said plurality of phase shift elements introduces an even integer multiple of 1800 of phase shift into said clock signal.

28. A semiconductor memory device in accordance with claim 23, wherein said plurality of phase shift elements comprises an even number of phase shift elements introducing collectively substantially 360° of phase shift into said clock signal.

29. A semiconductor memory device in accordance with claim 28, wherein said plurality of phase shift elements comprises an integer multiple of 360° of phase shift into said clock signal.

30. A semiconductor memory device in accordance with claim 23, wherein said clock signal has a frequency of at least about 1 GHz.

31. A semiconductor memory device in accordance with claim 23, wherein said plurality of segments of an elongate interconnect line are of varying length.

32. A semiconductor memory device in accordance with claim 31, wherein the aggregate length of said plurality of segments of an elongate interconnect line comprises an odd number of segments having an aggregate length such that the total phase shift provided by said phase shift elements is 180° or an even integer multiple of 180°.

33. A semiconductor memory device in accordance with claim 31, wherein the aggregate length of said plurality of segments of an elongate interconnect line comprises an even number of segments having an aggregate length such that the total phase shift provided by said phase shift elements is 360° or an integer multiple of 360°.

* * * * *

UNITED STATES PATENT AND TRADEMARK OFFICE
CERTIFICATE OF CORRECTION

PATENT NO. : 6,952,117 B2
DATED : October 4, 2005
INVENTOR(S) : Leonard Forbes

It is certified that error appears in the above-identified patent and that said Letters Patent is hereby corrected as shown below:

Column 11,
Line 20, "claim 27" should be -- claim 26 --.
Line 21, "1800" should be -- 180º --.

Signed and Sealed this

Third Day of January, 2006

JON W. DUDAS
*Director of the United States Patent and Trademark Office*